US012671431B2

(12) United States Patent
Niu et al.

(10) Patent No.: US 12,671,431 B2
(45) Date of Patent: Jun. 30, 2026

(54) CIRCUIT AND A METHOD FOR SAMPLING AN ANALOG SIGNAL

(71) Applicants: UNIVERSITEIT GENT, Ghent (BE); IMEC VZW, Leuven (BE)

(72) Inventors: Shengpu Niu, Ghent (BE); Joris Lambrecht, Oudenaarde (BE); Michiel Verplaetse, Nazareth (BE); Yin Xin, Sint-Denijs-Westrem (BE)

(73) Assignees: UNIVERSITEIT GENT, Ghent (BE); IMEC VZW, Leuven (BE)

( * ) Notice: Subject to any disclaimer, the term of this patent is extended or adjusted under 35 U.S.C. 154(b) by 92 days.

(21) Appl. No.: 18/580,918

(22) PCT Filed: Jul. 15, 2022

(86) PCT No.: PCT/EP2022/069928
§ 371 (c)(1),
(2) Date: Jan. 19, 2024

(87) PCT Pub. No.: WO2023/001715
PCT Pub. Date: Jan. 26, 2023

(65) Prior Publication Data
US 2024/0372558 A1     Nov. 7, 2024

(30) Foreign Application Priority Data
Jul. 20, 2021     (EP) ..................................... 21186607

(51) Int. Cl.
*H03M 1/50*     (2006.01)
*H03M 1/12*     (2006.01)

(52) U.S. Cl.
CPC ....... *H03M 1/1245* (2013.01); *H03M 1/1215* (2013.01)

(58) Field of Classification Search
CPC . H03M 1/1245; H03M 1/1215; H03M 1/0863
(Continued)

(56) References Cited

U.S. PATENT DOCUMENTS 8,466,819 B2 *   6/2013   Woodward ................ G02F 7/00
                                              341/137
8,902,093 B1 *   12/2014   Leuciuc .............. H03M 1/1245
                                              341/172

(Continued)

OTHER PUBLICATIONS

Du et al., "A 112-GS/s 1-to-4 ADC front-end with more than 35-dBc SFDR and 28-dB SNDR up to 43-GHz in 130-nm SiGe BiCMOS," IEEE Radio Frequency Integrated Circuits Symposium, Jun. 2-4, 2019, pp. 215-218.

(Continued)

*Primary Examiner* — Jean B Jeanglaude
(74) *Attorney, Agent, or Firm* — Workman Nydegger

(57) ABSTRACT
A sampling circuit for sampling an analog input signal including: a capacitive means, a reset switch, and a sampling switch; the reset switch and the sampling switch being connected to a signal generator circuit configured to provide periodic reset and sampling control signals to the respective switches for controlling their operation. The respective periodic reset and sampling control signals have equal duty factors and signal periods, and a phase delay with respect to one another being less than the signals' duty factor, thereby forming an overlap period during which the reset switch and the sampling switch remain closed.

12 Claims, 13 Drawing Sheets

(58) Field of Classification Search
   USPC ........................................................ 341/166
   See application file for complete search history.

(56) References Cited

U.S. PATENT DOCUMENTS

| | | | | |
|---|---|---|---|---|
| 9,571,118 | B1 * | 2/2017 | Gupta ................. | H03M 1/1245 |
| 10,751,160 | B2 * | 8/2020 | Philipps ........... | A61B 17/12172 |
| 2015/0341044 | A1 * | 11/2015 | Nakamura .......... | H03M 1/0624 |
| | | | | 341/118 |

OTHER PUBLICATIONS

Zandieh et al., "128-GS/s ADC Front-End with Over 60-GHz Input Bandwidth in 22-nm Si/SiGe FDSOI CMOS," IEEE BiCMOS and Compound Semiconductor Integrated Circuits and Technology Symposium (BCICTS), Oct. 15-17, 2018, pp. 271-274.

Carley et al.: "High-Speed Low-Power Integrating CMOS Sample-and-Hold Amplifier Architecture", Proceedings of the IEEE 1995 Custom Integrated Circuits Conference: Westin Hotel/Santa Clara Convention Center, Santa Clara California, May 1-4, 1995, pp. 543-546.
Thijssen et al.: "Low-Power Highly Selective Channel Filtering Using a Transconductor-Capacitor Analog FIR", IEEE Journal of Solid-State Circuits, vol. 55, No. 7, as early as Jul. 1, 2020, pp. 1785-1795.
Ge et al.: "Temporal Noise Analysis of Charge-Domain Sampling Readout Circuits for CMOS Image Sensors", Sensors, vol. 18, No. 3, Feb. 27, 2018, pp. 1-16.
Vasilakopoulos et al., "A 108GS/s Track and Hold Amplifier with MOS-HBT Switch", IEEE MTT-S International Microwave Symposium (IMS), May 22-27, 2016, pp. 1-4.
International Search Report from corresponding PCT Application No. PCT/EP2022/069928, Nov. 17, 2022.
Extended European Search Report from corresponding EP Application No. 21186607.4, Jan. 21, 2022.

* cited by examiner

**CIRCUIT AND A METHOD FOR SAMPLING
AN ANALOG SIGNAL**

TECHNICAL FIELD

The present disclosure relates to circuitry and method for sampling an input signal such as an analog signal.

BACKGROUND

Analog-to-digital converters, ADCs, employ a sampling circuit for sampling an analog signal. The sampling circuit samples the analog signal at respective time instances to obtain samples representing the magnitude of the analog signal at these times, i.e., sampling, instances. The obtained samples are then processed by the subsequent stages of the ADC, i.e., the quantized and encoder stages, to represent the samples in a binary form, i.e., bits. Conventional sampling circuits, typically, operate in two or three phases or operations. Differently from voltage-based sampling circuit, charge-based sampling circuits, i.e., sampling circuits in which the analog signal is integrated over a capacitor to obtain a sample of the magnitude of the analog signal, operate using three phases. In the first phase, i.e., the so-called sampling phase, a sample of the analog signal is obtained, in the second phase, i.e., the hold phase, the obtained sample is held unchanged to allow the ADC to process the sample and thus to obtain its digital representation, and in the last third phase, i.e. the reset phase, the sampling circuit is reset to prepare the sampling circuit, i.e., to clear the sampled information on capacitor, for the next sampling phase. Charge-based sampling circuits thus offer several advantages in comparison with the voltage-based sampling circuits. First, the bandwidth of the charge-based sampling circuit is determined by the length of the sampling phase, i.e., the integration time, instead of the RC time constant in voltage-based sampling circuits. Second, charge-based sampling circuits offer an improved jitter performance especially when used to sample high-speed input signal. Despite these advantages, charge-based sampling circuits have a higher power consumption and require a more complex control mechanism, i.e., clock mechanism. These disadvantages become even more critical in high-speed designs as time-interleaved charge-based sampling circuits require even more complex clock mechanism in terms of both clock generation and clock distribution. More specifically, an M-channel time-interleaved charge-based require the generation of 1/M duty-cycle control signals in the GHz frequency range with the duty-cycle dependent on the number of the sampling channels which apart from increasing the power consumption dramatically is also very hard to achieve.

Additionally, conventional high-speed sampling circuits such as the hierarchical two-level current logic charge-based sampling circuits as described in X. Q. Du et al., "*A 112-GS/s 1-to-4 ADC front-end with more than 35-dBc SFDR and 28-dB SNDR up to 43-GHz in 130-nm SiGe BiCMOS*," IEEE RFIC 2019, pp. 215-218, and the sampling circuits based on SiGe technology as described in A. Zandieh et al., "*128-GS/s ADC Front-End with Over 60-GHz Input Bandwidth in 22-nm Si/SiGe FDSOI CMOS*," IEEE BCICTS 2018, pp. 271-274 and K. Vasilakopoulos et al., "*A 108GS/s track and hold amplifier with MOS-HBT switch*", IEEE MTT-S IMS 2016, pp. 1-4, are highly sensitive to clock slew rate. Clock slew rate causes input-dependent variations in the sampling time which leads to a significant sampling error that is hard to calibrate.

SUMMARY

An object of embodiments of the present disclosure is to provide a sampling circuit overcoming the above limitations thereby enabling high-speed operation insensitive to clock slew.

The scope of protection sought for various embodiments of the invention is set out by the independent claims. The embodiments and features described in this specification that do not fall within the scope of the independent claims, if any, are to be interpreted as examples useful for understanding various embodiments of the invention.

This object is achieved, according to a first example aspect of the present disclosure, by a charge-based sampling circuit for sampling an analog input signal comprising: a capacitive means, a reset switch, and a sampling switch; the reset switch and the sampling switch being connected to a signal generator circuit configured to provide periodic reset and sampling control signals to the respective switches for controlling their operation; wherein the respective periodic reset and sampling control signals have equal duty factors and signal periods, and a phase delay with respect to one another being less than the control signals' duty factor, thereby forming a four-phase operation wherein during a reset phase, the reset switch is closed such that the terminals of the capacitive means are shorted causing the capacitive means to discharge, and the sampling switch is open disconnecting the analog input signal from the capacitive means;

during a subsequent overlap phase the reset switch remains closed and the sampling switch is closed connecting the analog input signal to the capacitive means thereby, by the non-zero resistance of the reset switch, partly integrating the analog input signal onto the capacitive means by a pre-charge value;

during a subsequent integration phase, the reset switch is open and the sampling switch remains closed thereby integrating the analog input signal onto the capacitive means;

during a subsequent hold phase the sampling switch is open and the reset switch remains open such that an integrated charge on the capacitive means is held constant.

In particular, the sampling circuit is a charge-based sampling circuit that comprises capacitive means such as a capacitor, a reset switch, and a sampling switch. The reset switch and the sampling switch are connected to a signal generator circuit which in turn is configured to provide periodic reset and sampling control signals to the respective switches. The control signals thus control the operation of the respective switches, i.e., the duration of time within a signal period during which a respective switch is open and closed. Depending on which switch is closed and/or open, i.e., on their ON and/or OFF state respectively, the sampling circuit enters different operation phases. For example, during an integration phase, the input signal is integrated on the capacitive means and then held constant on the capacitive means during the hold phase to allow the processing of the sampled input signal by the subsequent stages of the analog-to-digital circuit. More specifically, the signal generator circuit is configured to generate the control signals analog or digital control signals with equal duty factors and signal periods. That is, during one half of the signal period, digital reset and sampling control signals will have a logical '1' value, and, the other half of the signal period, the digital control signals will have a logical '0' value. Further, the signal generator circuit is configured to generate the control signals with a phase delay between them. For example, the sampling control signal has a phase delay with respect to the reset control signal. Furthermore, the signal generator circuit is configured to generate the control signals with a phase delay that is less than the signals' duty factor. For example, if the control signals have a duty factor of 50% of the signal period, the phase delay should be less than the duty factor. This assures that both the reset control signal and the sampling control signal have an overlap period. In the case the control signals are digital, this assures that both control signals have the same value, e.g., a logical '1' and logical '0', for a certain period of time. In other words, there is a period of time during which both switched are closed and another period of time when both switches are open. The period of time during which both switches are closed is referred to as the overlap period, while the period during which both switches are open is commonly referred to as the hold period. The duration of the overlap period depends on the requirements to be met by the sampling circuit. For example, in some applications, it may be required that the overlap period is as long as possible to assure a shorter integration time, i.e., shorter sampling phase, and thus a higher sampling bandwidth. In other applications, it may be desired that the overlap period and the hold period have the same duration to simplify the design of the signal generation circuit.

During the overlap phase, the sampling circuit performs a so-called AND operation. This AND operation has a similar but opposite effect on the bandwidth with respect to the slew rate of the control signals in comparison to the AND operation observed during the sampling phase. As a result, each sampling circuit performs two AND operations with an opposite effect. Their effect on the bandwidth of the sampling channel thus cancels each other. As a result, operating the sampling circuit in this manner reduces its sensitivity to the slew rate of the control signals drastically. In other words, the bandwidth of the sampling circuit becomes almost insensitive to the slew rate of the control signals. The sampling circuit is thus suitable for use in wideband data communication systems employing high-speed ADCs.

Further, introducing the overlap phase allows using control signals with equal duty factors and signal's period. This greatly simplifies the generation of the control signals and therefore the implementation of the signal generator circuit. No complex circuitry is required for generating control signals in contrast to conventional solutions which require the use of AND gate circuits. Furthermore, the control signals controlling the operation of the sampling circuit, i.e., their properties, are much simpler than the control signals required for conventional sampling circuits. In other words, the proposed clock strategy employed by the sampling circuit is simpler than the clock strategy required by conventional sampling circuits. Herein, the sampling circuit operation is controlled by a 1/M data rate and 50% duty cycle control signals.

According to example embodiments, the reset and sampling control signals can have a square waveform, or a sinusoidal waveform. Furthermore, the reset and sampling control signals generated by the signal generator circuit may have variable clock slew rates. In other words, the use of four operation phases rather than three as in conventional charge-based sampling circuits allows the usage of a variety of control signals to control the sampling circuit operation. This makes the sampling circuit suitable for various high-speed receiver system. For example, control signals with a square waveform and a slew rate of 25% may be desired when quadrature-based sampling is required, i.e., when the input signal needs to be sampled into quadrature channels.

According to example embodiments, the signal generator circuit is configured to generate control signals with a duty factor corresponding to one-half the control signals' period and a phase delay greater than zero and smaller than one-half of the control signals' period. Preferably, the phase delay between the control signals corresponds to half the control signals' duty factor, i.e., a quarter of the control signals' period.

Control signals with the above characteristics satisfy the requirements for a sampling circuit for a variety of analog-to-digital circuits. Additionally, using control signals with such characteristics further relaxes the network for distributing the control signals from the signal generator circuit to the respective switches. Furthermore, the synchronization between the control signals is considerably relaxed as the duration of the overlap and the sampling phase are controlled by adjusting the phase delay between the control signals. As a result, the implementation of the signal distribution circuit is significantly relaxed and thus leads to considerable savings in terms of power consumption.

Furthermore, the proposed clock strategy allows to design of the control signal distribution network for one type of control signals, e.g., square-wave control signals, and to use the designed signal distribution network with another type of control signals, e.g., sinusoidal-wave control signals. The sampling circuit will still operate properly as all the control signals have the same characteristics, i.e., duty cycle, frequency, and slew rate. As the control signals passed over the signal distribution network, pass the same path, the control signal at the output of the signal distribution network would maintain the same characteristics. As long as these characteristics are preserved, the sampling circuit will still operate properly irrespective of the slew rate of the control signals. For example, if the signal distribution network is designed to distribute 50% duty cycle 50 GHz sinusoidal-wave clock, the signal distribution network can properly distribute 50% duty-cycle 30 GHz square-wave clock, as long as the 30 GHz output clock's duty cycle is 50%.

According to a second example aspect, a time-interleaved charge-based sampling circuit comprising M charge-based sampling circuits according to the first example aspect is disclosed configured to provide M sampled signals in a time-interleaved manner In a time-interleaved scenario, these M sampling circuits are referred to as sampling channels and are operated so that the respective sampling channels successively sample an analog input signal. In other words, the M sampling channels together provide M sampled signals which reflect the analog input signal. The time-interleaved sampling circuit further comprises a signal generator circuit. The signal generator circuit is configured to provide periodic reset and sampling control signals for the respective sampling circuits. Similar to the first example aspect, the periodic reset and sampling control signals for the respective sampling circuits have equal duty factors and signal periods, and wherein the periodic reset and sampling control signals for a respective sampling circuit have a phase delay with respect to one another being less than the signals' duty factor. Doing so, introduces a fourth operation phase, i.e., an overlap phase, during which the reset switch and the sampling switch remain closed. During this overlap phase, the sampling channels of the time-interleaved sampling circuit perform an additional AND operation as detailed above with respect to the first example aspect. This additional AND operation has a similar but the opposite effect with respect to the slew rate of the control signals in comparison to the AND operation observed during the sampling phase. As a result, each sampling channel performs two AND operations with an opposite effect and thus their effect on the bandwidth of the sampling channel cancels each other. As a result, operating the sampling channels of the time-interleaved sampling circuit in this manner reduces their sensitivity to slew rate drastically. In other words, the bandwidth of the time-interleave sampling circuit becomes almost insensitive to the slew rate of the control signals.

According to example embodiments, the operation of the respective charge-based sampling circuits is delayed by 1/M of the control signals' period. By delaying the operation of the respective sampling circuit by 1/M of the control signals' period, it is assured that the respective sampling channels of the time-interleaved sampling circuit observe the same duration of the reset, overlap, sampling, and hold phases. Further, doing so allows realization of successive M-channel time-interleaved sampling circuit with simplified signal generation circuit's design, insensitive to the slew rate of the control signals and offering a high sampling bandwidth.

According to example embodiments, the duration of the reset phase is 1/M of the control signal's period, and wherein the duration of the overlap phase is one-half of the control signal's period minus 1/M of the signal's period. In other words, the clock strategy used to control the operation of the time-interleaved sampling circuit is much simpler than the clock strategy of conventional time-interleaved sampling circuits. Herein, the operation of the respective sampling circuits is controlled by 1/M data rate and 50% duty cycle control signals. This clock strategy eliminates the need for complex circuits for the generation of the control signals. In other words, the signal generator circuit is simpler as dedicated AND gate circuits for generating control signals with more complex signal characteristics are not needed. This in turn allows saving considerable power consumption and chip area. Furthermore, the control signal distribution network and control signals synchronization are also considerably simplified.

The other example embodiments of the first example aspect may further be applied as example embodiments to the second example aspects.

According to a third example aspect, an analog-to-digital converter is disclosed comprising a charge-based sampling circuit according to the first example aspect or a time-interleaved charge-based sampling circuit according to the second example aspect. Thus, the advantages and the various example embodiments of the first example aspect of the second example aspect can be applied as example embodiments to the third example aspect.

According to a fourth example aspect, a method for sampling an analog input signal by means of a charge-based sampling circuit comprising a capacitive means, a reset switch, and a sampling switch is disclosed, the method comprising providing periodic reset and sampling control signals to the respective switches for controlling their operation; wherein the respective periodic reset and sampling control signals have equal duty factors and signal periods, and a phase delay with respect to one another being less than the control signals' duty factor; and wherein the providing the reset and sampling control signals further comprises:

during a reset phase, closing the reset switch such that the terminals of the capacitive means are shorted causing the capacitive means to discharge, and keeping the sampling switch open thereby disconnecting the analog input signal from the capacitive means;

during a subsequent overlap phase keeping the reset switch closed and closing the sampling switch thereby connecting the analog input signal to the capacitive means and thereby, by the non-zero resistance of the reset switch, partly integrating the analog input signal onto the capacitive means by a pre-charge value;

during a subsequent integration phase, opening the reset switch and keeping the sampling switch closed thereby integrating the analog input signal onto the capacitive means; and during a subsequent hold phase opening the sampling switch and keeping the reset switch open such that an integrated charge on the capacitive means is held constant.

In particular, the method comprises controlling the reset switch with a periodic reset control signal to discharge the capacitive means, and controlling the sampling switch with a periodic sampling control signal to charge the capacitive means with the analog input signal. Similar to the first example aspect, the periodic reset control signal and the periodic sampling control signal have equal duty factors and signal periods, and, a phase delay with respect to one another being less than the signals' duty factor. Forming the control signals in this way assures that there is an overlap period during both the reset and sampling control signals have the same values and, therefore, the reset and the sampling switch of the sampling circuit remain closed.

Thus, the advantages and the various example embodiments of the first example aspect can be applied as example embodiments to the second example aspect.

According to a fifth example aspect, a method for sampling an analog input signal by means of a time-interleaved charge-based sampling circuit is disclosed; the time-interleaved charge-based sampling circuit comprising M charge-based sampling circuits, the charge based sampling circuits respectively comprising a capacitive means, a reset switch, and a sampling switch and being configured to sample the analog input signal to provide M sampled signals related to the analog input signal; the method comprising controlling the reset and sampling switch of the respective M charge-based sampling circuits by the method according to the fourth example aspect.

In particular, the time-interleaved circuit comprises M sampling circuits which are commonly referred to as sampling channels. Each sampling circuit or sampling channel comprises a capacitive means, a reset switch, and a sampling switch. The sampling channels are configured to sample the analog input signal and, thus, to provide M sampled signals related to the analog input signal. Similar to the second example aspect, the reset and sampling switches of the respective sampling channels are controlled by a periodic reset control signal to discharge its capacitive means and a periodic sampling control signal to conduct the analog input signal current onto its capacitive means. Similar to the second example aspect, the periodic reset and sampling control signal for the sampling circuits have equal duty factors and signal periods, and the periodic reset and sampling control signals for a respective sampling circuit have a phase delay with respect to one another being less than the signals' duty factor. Doing so, introduces a fourth operation phase, i.e., an overlap phase, during which the reset switch and the sampling switch remain closed. As a result, the sampling channels perform two AND operations with an opposite effect with respect to the slew rate of the control signals. As these two AND operations work together, their effect on the bandwidth of the sampling channel cancels each other. As a result, the bandwidth of the respective sampling channels of the time-interleaved sampling circuit reduces the sensitivity of the sampling channels to the slew rate of the control signals drastically. In other words, the bandwidth of the time-interleave sampling circuit becomes almost insensitive to the slew rate of the control signals.

According to example embodiments, the method further comprising controlling the reset and the sampling switches of the respective charge-based sampling circuits such that the operation of the respective charge-based sampling circuits is delayed by 1/M of the control signals' period. By doing so, it is assured that the respective sampling channels of the time-interleaved sampling circuit observe the same duration of the reset, overlap, sampling, and hold phases. Further, doing so allows realization of successive M-channel time-interleaved sampling circuit with simplified signal generation circuit's design, insensitive to the slew rate of the control signals and offering a high sampling bandwidth.

The various example embodiments of the first and second example aspects can be applied as example embodiments to the fifth example aspects.

BRIEF DESCRIPTION OF THE DRAWINGS

Some example embodiments will now be described with reference to the accompanying drawings.

DETAILED DESCRIPTION OF EMBODIMENT(S)

The present disclosure discloses a sampling circuit and more specifically a charge-based sampling circuit wherein the sampling circuit is operated in such a way that an additional overlap phase is introduced between the reset and integration phases. Thus, instead of the conventional three-phase operation, the sampling circuit is operated according to a four-phase operation.

Figures 1A, 1B, 1C:
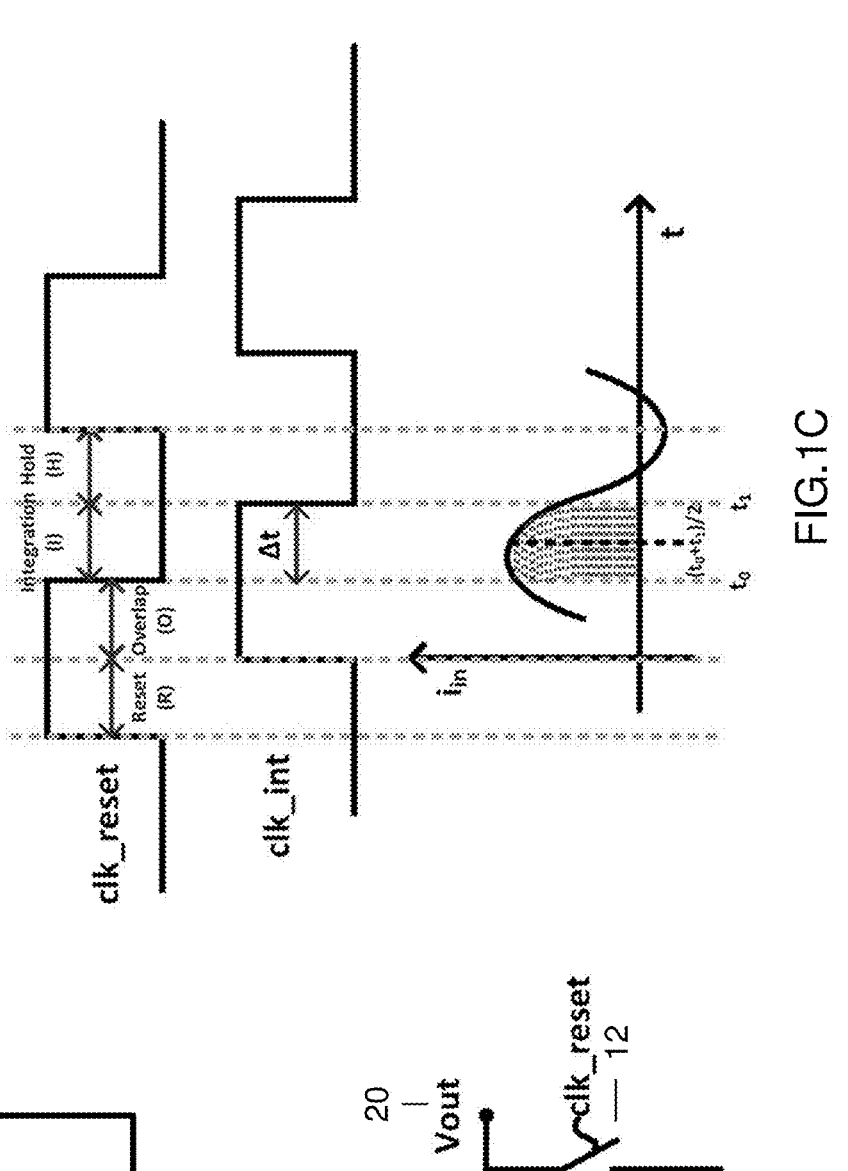
FIG. 1A shows a simplified block scheme of a sampling circuit according to example embodiments of the present disclosure.
FIG. 1B shows a simplified circuit model of a sampling circuit according to an example embodiment of the present disclosure.
FIG. 1C shows an example clock strategy for the sampling circuit model of FIG. 1B according to example embodiments of the present disclosure.

The operation of the sampling circuit and its operation will be now explained with reference to FIG. 1A to FIG. 1D. FIG. 1A shows a simplified block scheme of the sampling circuit, FIG. 1B shows a simplified circuit model of the sampling circuit, FIG. 1C shows an example clock strategy for the sampling circuit model of FIG. 1B, and FIG. 1D shows an example time-domain output of the sampling circuit model of FIG. 1C.

As shown in these figures, the operation of the sampling circuit 100 is controlled by a sampling control signal, i.e., clk_int, 51, and a reset control signal, i.e., clk_reset, 52 which are generated by a signal generator circuit 50. The controls signals can have any slew rate which means their waveforms can range from square to sinusoidal. In the example shown in FIG. 1C, the control signals have a square waveform with the same signal period and a 50% duty cycle or duty factor, i.e., it corresponds to one-half of the period of the control signals. In the ideal case, this means that the rising or falling time of the control signals is zero which also means that the slew rate is infinite. But in practice, the slew rate can never reach infinite. The clock rising or falling time may be for example 0.5% of the control signal's period. Further, the sampling control signal 51 is delayed with respect to the reset control signal 52. This phase delay can be greater than zero and smaller than the duty cycle of the control signals. In the example shown in FIG. 1C, the phase delay between the control signals, i.e., $\Delta t$, is one-half of the signals' duty cycle.

The sampling control signal and the reset control signal respectively control the operation of the sampling switch 11 and the reset switch 12 of the sampling circuit 100. The sampling circuit is thus operated in accordance with a four-phase operation. In the first, reset phase, R, the reset switch 12 is closed and the sampling switch 11 is open. The terminals of the capacitor 30 are shorted causing the capacitor to discharge previously sampled information during the reset phase. The charge present on the capacitor drops to zero as shown in FIG. 1D. In the second, overlap phase, O, both the reset switch and the sampling switch are closed. Closing both switches causes the input signal to be conducted to the power supply by the reset switch. As a result, capacitor 30 remains uncharged and the voltage at the output of the sampling circuit remains zero as shown in FIG. 1D. In the next phase, i.e., the integration phase, I, the sampling switch 11 is closed while the reset switch 12 remains opened. The capacitor 30 is now connected to the input signal to charge the capacitor to the input signal, i.e. $Iin=gm*Vin$. In the last phase, i.e., the hold phase, H, the sampling switch 11 is opened with the reset switch remaining in an open state, thus connecting the charged capacitor 30 to the output 20 of the sampling circuit. The charge on the capacitor is held constant which allows a subsequent stage to process the output of the sampling circuit, i.e., Vout, during the hold phase as needed.

Figure 1E:
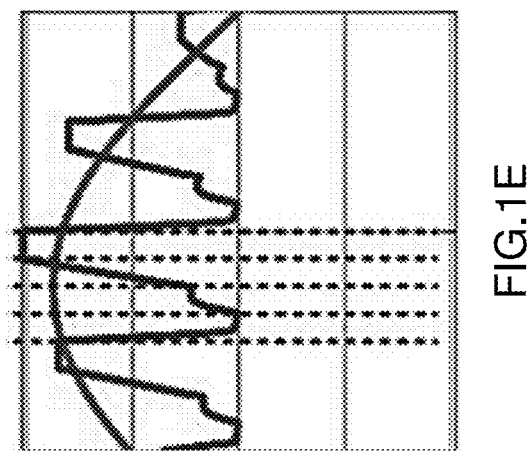
FIG. 1E shows another example time-domain output of the sampling circuit model of FIG. 1B according to example embodiments of the present disclosure.
Figure 1D:
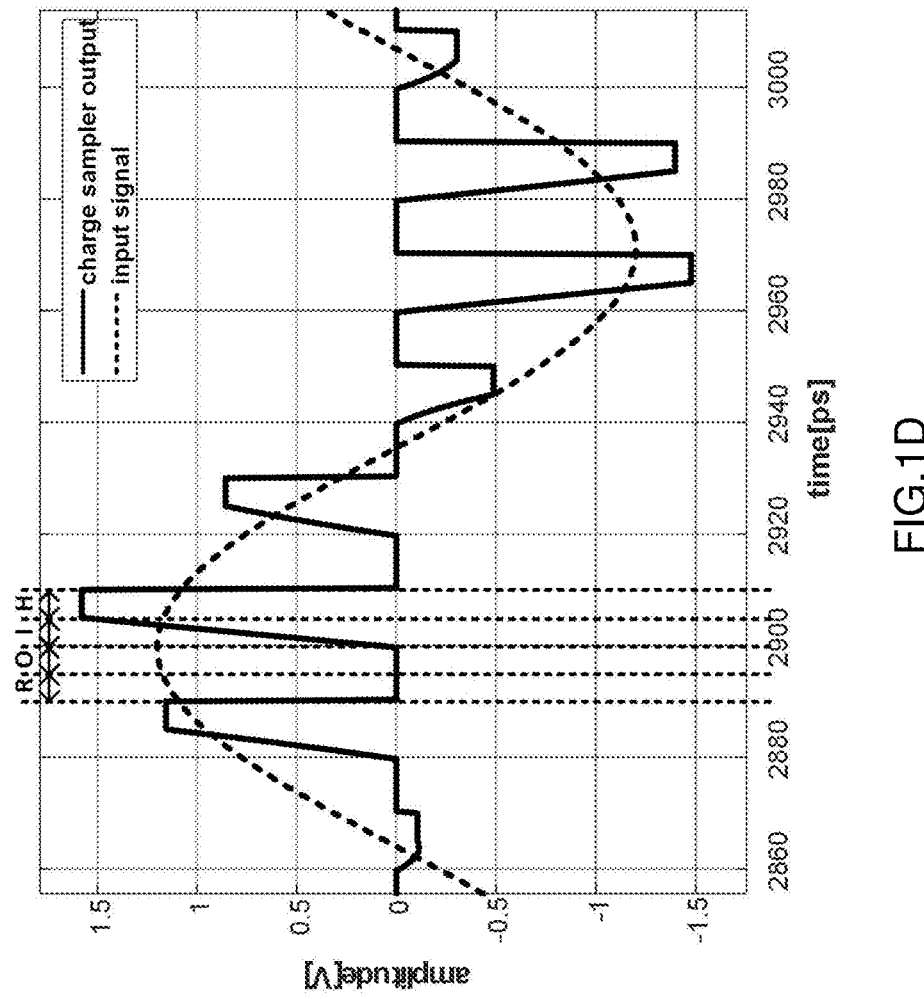
FIG. 1D shows an example time-domain output of the sampling circuit model of FIG. 1B according to example embodiments of the present disclosure.

FIG. 1D shows the waveform of the output of the sampling circuit in the case when the control signals have an ideal square waveform and the switches are switched with a zero on-state resistance, i.e., ideal switches. In practice, the waveform of the control signal is not an ideal square wave and the switches, and especially switch 12, are not ideal which means their on-state resistance is non-zero. Thus, during the overlap phase, there will be some charge present on the capacitor as shown in FIG. 1E as not all the input signal current is conducted to the power supply as shown in FIG. 1D. Part of the input signal will be thus integrated on the sampling means 30 leading to a pre-charge value on the sampling means. This operation causes a low-pass filtering effect representing the proportion of the current integrated on the capacitor during the overlap phase. The low-pass filtering can be represented with the transfer function H(z)=1/1−az⁻¹, where α represents the proportion of the current integrated on the capacitor. As the equivalent on-state resistance of both switches is inversely proportional to the DC current passing through them, its value can be lowered by increasing the DC current from the trans-conductance stage. With the switch equivalent resistance lower down, the value of a becomes smaller, and the bandwidth of the low-pass filter increases. At this stage, the low-pass filtering effect no longer affects the sampler performance. This is because the bandwidth of the low-pass filter is higher than half the control signal frequency. Additionally, as this low-pass filtering effect is in fact a passive filtering effect it does not affect the linearity of the sampling circuit.

The principle of operation and the effect of the overlap phase on the bandwidth of the sampling circuit will be now explained in more detail with reference to the time-interleaved sampling circuit.

Figures 2A, 2B:
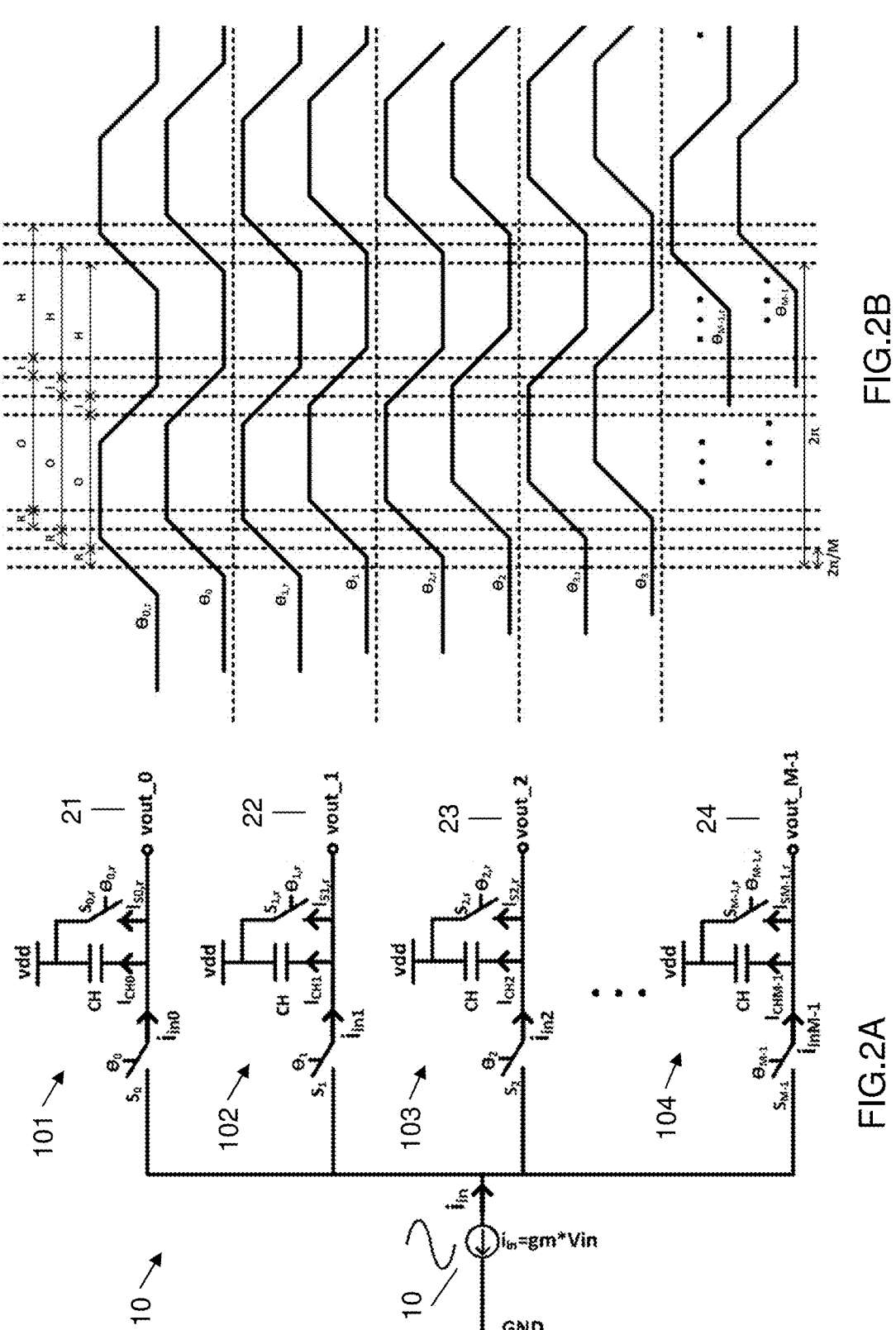
FIG. 2A shows a simplified circuit model of a time-interleaved sampling circuit according to example embodiments of the present disclosure.
FIG. 2B shows an example of control signals for the time-interleaved sampling circuit model of FIG. 2A according to example embodiments of the present disclosure.
Figures 2C, 2D:
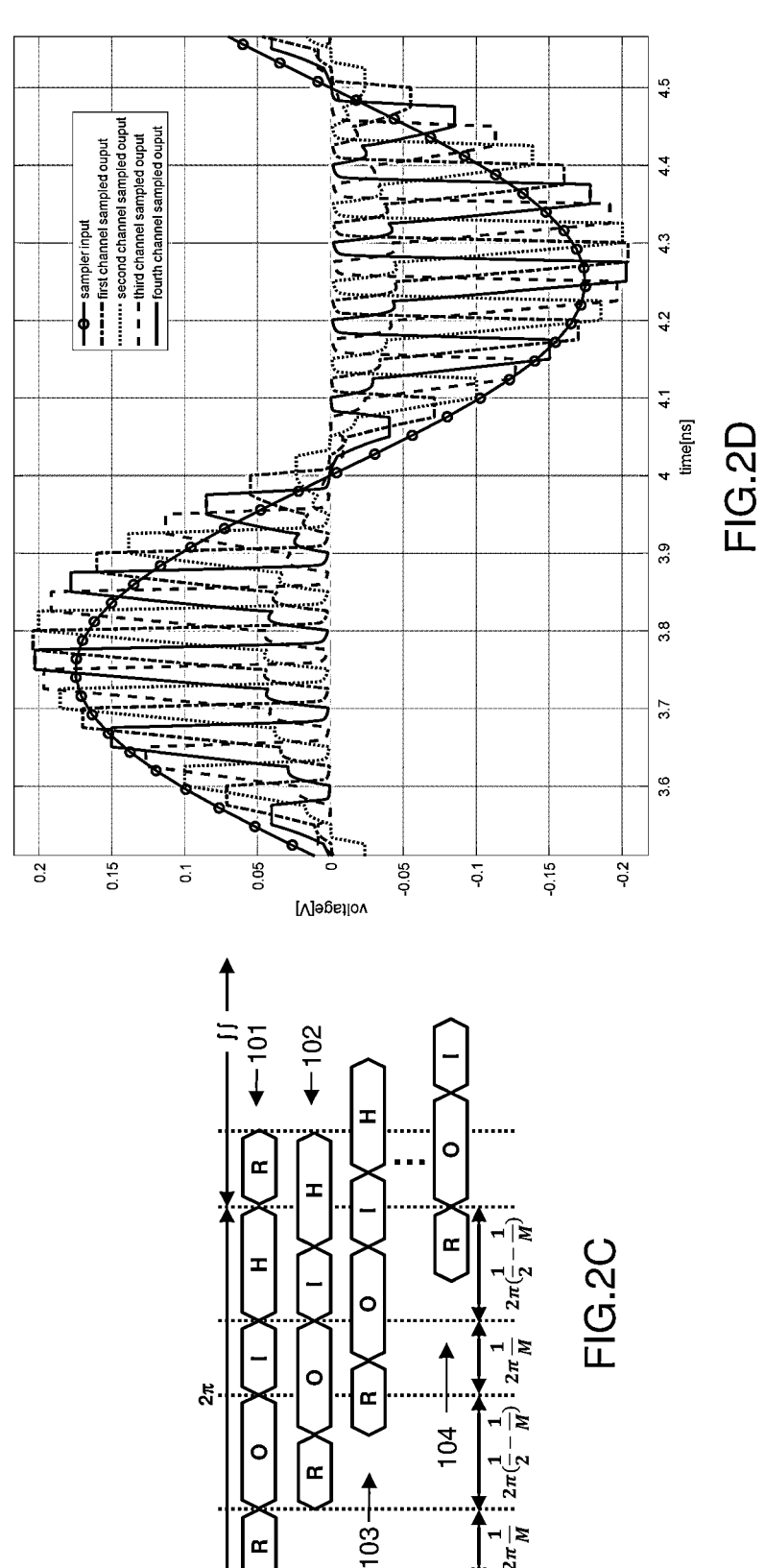
FIG. 2C shows an example clock strategy schema for the time-interleaved sampling circuit model of FIG. 2A according to example embodiments of the present disclosure.
FIG. 2D shows an example time-domain output of the time-interleaved sampling circuit model of FIG. 2A according to example embodiments of the present disclosure.

The present disclosure further discloses a time-interleaved implementation employing the same four-phase operation principle as described above with reference to the single-channel sampling circuit 100 of FIG. 1A and FIG. 1B. The time-interleaved sampling circuit and its operation will be now explained with reference to FIG. 2A to FIG. 2D. FIG. 2A shows a simplified model of a time-interleaved sampling circuit, FIG. 2B shows an example of control signals for the time-interleaved sampling circuit model of FIG. 2A, FIG. 2C shows an example clock strategy schema for the time-interleaved sampling circuit model of FIG. 2A, and FIG. 2D shows an example time-domain output of the sampling circuit model of FIG. 2A.

In this example, the time-interleaved sampling circuit 110 is shown to comprise M sampling channels 101 to 104. The respective M sampling channels have the same implementation as the sampling circuit 100 shown in FIG. 1B. Similarly, the sampling channels are operated using the same principle as described above with reference to FIG. 1B to FIG. 1E. In particular, the sampling switches S₀ to S_{M-1} of the respective sampling channels receive respective sampling control signals θ₁ to θ_{M-1}. Similarly, the reset switches S_{0,r} to S_{M-1,r} receive respective reset control signals, i.e., θ_{1,r} to θ_{M-1,r}. Similar to the example of FIG. 1B, the sampling and reset control signals can have any slew rate which means their waveforms can range from square to sinusoidal. In this example, and as shown in FIG. 2B, the sampling control signals are 1/M data rate, 50% duty-cycle, evenly phase-shifted signals, and the reset control signals θ_{1,r} to θ_{M-1,r} are 1/M data rate, 50% duty-cycle, evenly phase-shifted signals and a rising and falling time of 25% the control signal's period. Furthermore, the reset control signals are leading the sampling control signals θ₁ to θ_{M-1} by 1/M clock period signals. The sampling channels 101 to 104 of the time-interleaved sampling circuit 110 are thus controlled using the clock strategy schema as shown in FIG. 2C. As it can be seen, the duration of the R phase is 2π1/M the duration of the O phase is 1π(1/2−1/M), the duration of the I phase is the same as the duration of the R phase, and the duration of the H phase is the same as the duration of the O phase.

Figure 3A:
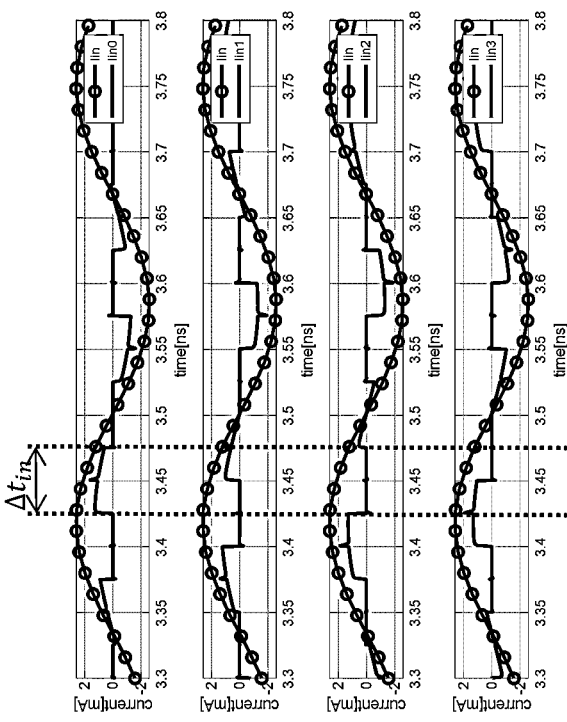
FIG. 3A to FIG. 3C shows examples of the input signal current steered to the respective sampling channels of the time-interleaved sampling circuit of FIG. 2A for sampling control signals with different slew rates.
Figure 3A:
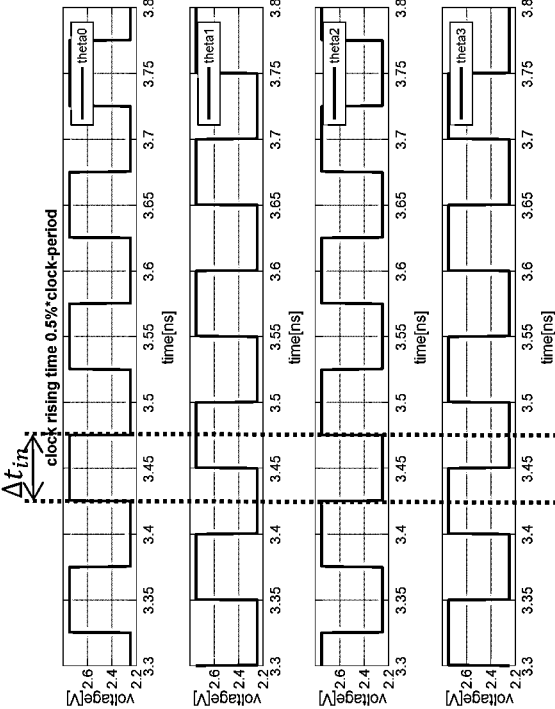
Figure 3C:
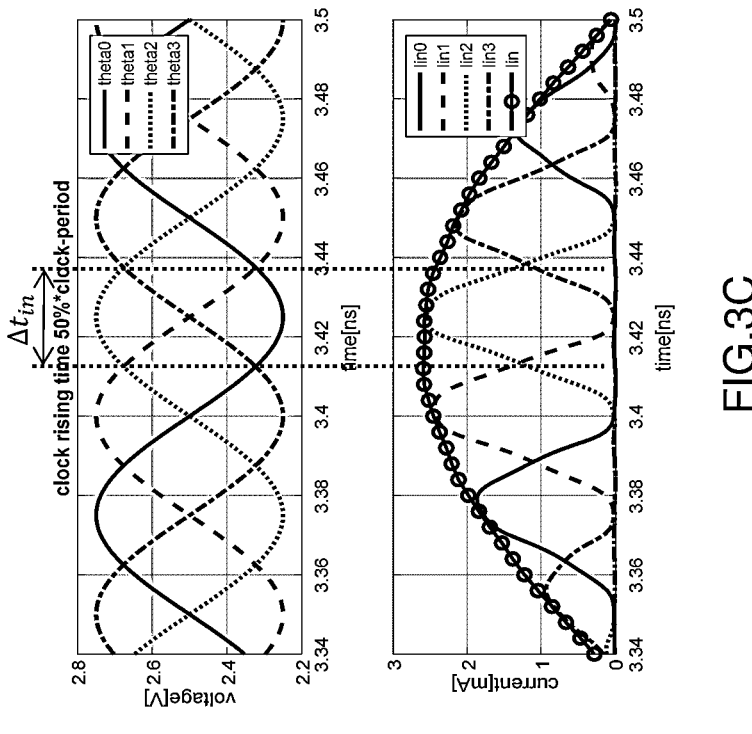
Figure 3B:
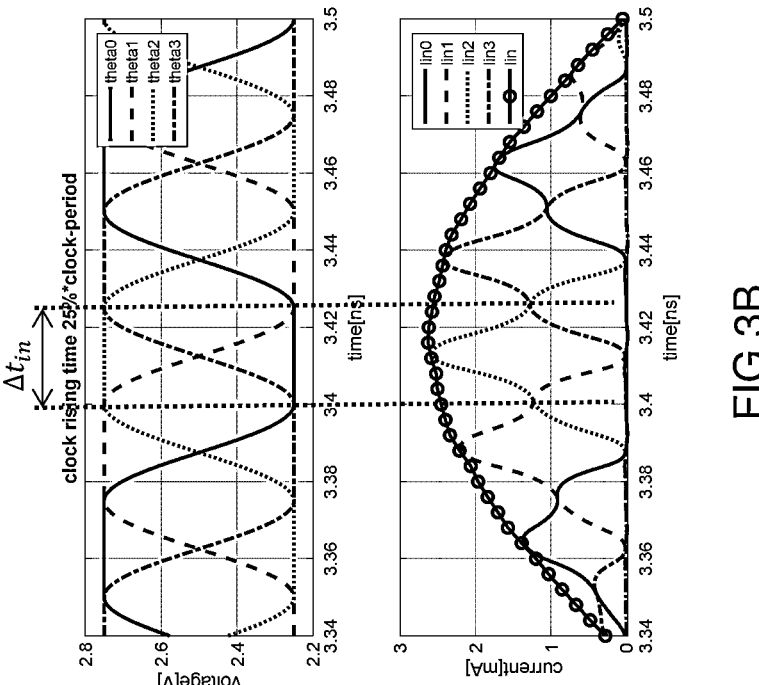

An example of such sampling control signals θ₀ to θ₃ for a four-channel time-interleaved sampling circuit are shown in FIG. 3A. More specifically, the sampling control signals are 1/M data rate, 50% duty cycle signals, and evenly phase-shifted by a quarter of the control signal period. As the sampling control signals are phase-shifted with one another, the sampling switches S₀ to S_{M-1} are turned on and off, steering the input current Iin alternatively into sampling capacitors CH of the respective sampling channels 101 to 104. This results in M evenly phase-shifted current pulses Iin0 to Iin3 being integrated on the sampling capacitors CH in turn. As the on and off states of the switches depend on the equivalent resistance of the switches, which in turn is determined by the gate-source voltage, Vgs, in the case of a CMOS switch, the current passing through these switches is strongly shaped by the Vgs voltage of the switch. In the case of an HBT switch, the equivalent resistance depends on the base-emitter voltage, Vbe. FIG. 3A to FIG. 3C show three simulation results showing the current passing through the sampling switches S₀ to S₃ for a four-channel time-interleaved sampling circuit for sampling control signals with a rising time of 0.5%, 25%, and 50% the signal's period. As it can be seen from the FIG. 3A and FIG. 3B, the input current pulses Iin0 to Iin3 of the four channels 101 to 104 is strongly shaped by respective sampling control signals, i.e., θ₀ to θ₃, and consequently their equivalent pulse width Δtin becomes shorter with clock slew rate decreasing. Otherwise said, switches S₀ to S_{M-1} share the input current Iin from the trans-conductance stage 10 at the control of the sampling control signal θ₁ to θ_{M-1}. This can be viewed as an AND operation formed by switches S₀ to S_{M-1} and their respective sampling control signals θ₁ to θ_{M-1}. This AND operation is herein referred to as a current-demux AND operation. Additionally, with clock rising time increasing, i.e., with Δtin decreasing, the resultant sampling circuit 110 bandwidth increases by over 50% as denoted by curve 402 in FIG. 4. This can be explained by the fact that the current-demux AND operation become stronger with the clock rising time increasing. For the example of FIG. 3A, the ON state of the sampling switches last almost half of the clock period, and the input pulse width Δt_{in} is also close to half of the clock period, i.e., Δt_{in} is around 50%*signal period. For a slew rate ranging from FIG. 3A to FIG. 3B, the Δt_{in} will range from around 50% of the signal period to 25% the signal period, i.e., 25%*signal period<Δt_{in}<50%*signal period. For the slew rate of 25% of the signal period, i.e., for fully sinusoidal sampling control signals, the ON state time of the sampling switches and the input pulse width Δt_{in} closes to only a quarter of the period of the sampling control signal. In contrast to conventional solution, herein the bandwidth of the sampling circuit is inversely proportional to the duration of the integration time. More specifically, the bandwidth of the sampling circuit is the sampler bandwidth is $$\frac{0.44}{\Delta t},$$

with $\Delta t$ being the integration time which is a part of $\Delta t_{in}$.

Figure 4A:
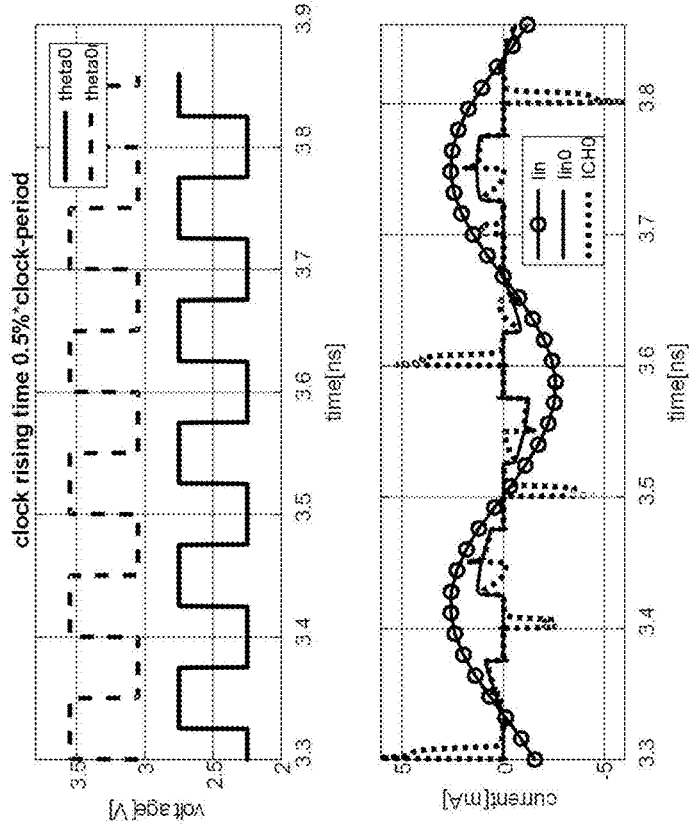
FIG. 4A to FIG. 4C shows current signals observed at the sampling means in a sampling channel of the time-interleaved sampling circuit of FIG. 2A for sampling control signals with different slew rates.
Figure 4A:
Figure 4A:
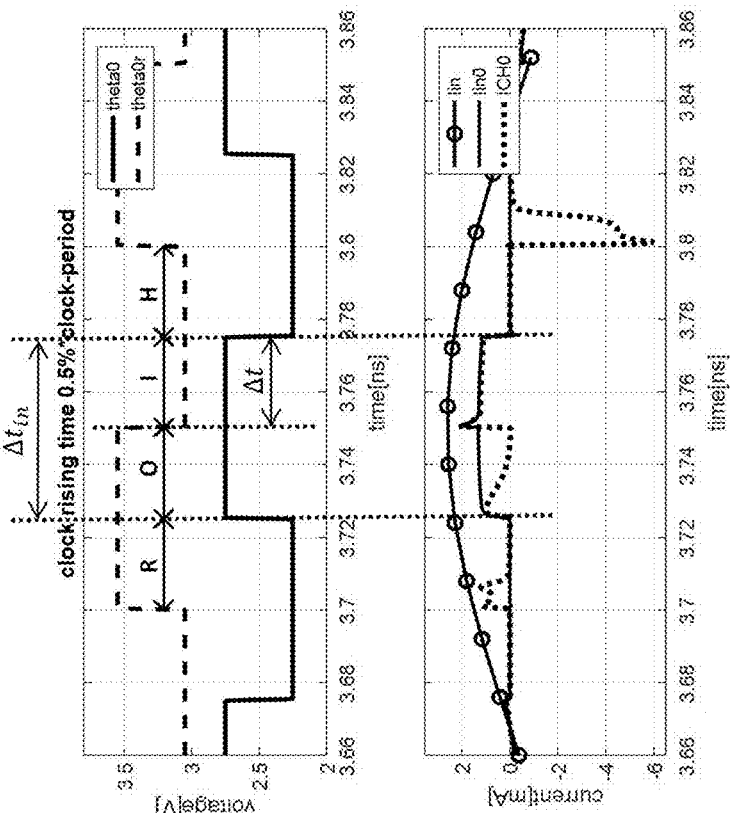
Figure 4B:
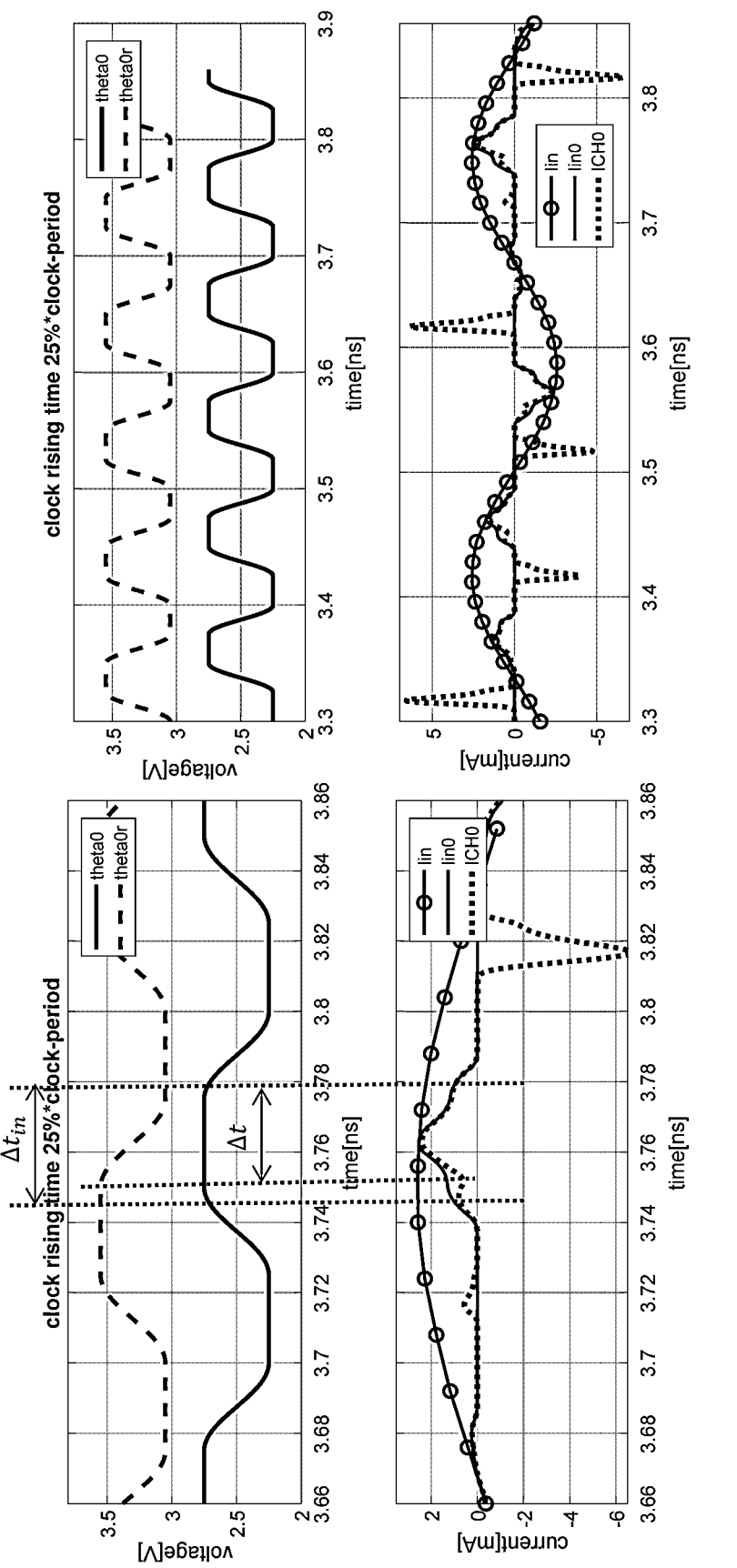

Further as shown in FIG. 4A, the reset control signals $\theta_{1,r}$ to $\theta_{M-1,r}$ are 1/M data rate, 50% duty-cycle, evenly phase-shifted signals. Furthermore, the reset control signals are leading the sampling control signals $\theta_1$ to $\theta_{M-1}$ by 1/M clock period signals. For simplicity reasons, FIG. 4A shows the reset and sampling control signals for the first sampling channel 101, i.e., control signals $\theta_0$ and $\theta_{0,r}$. As a result, both control signals $\theta_0$ and $\theta_{0,r}$ for the first sampling channel 101 are both on a high level at the O phase. Thus, the input current Iin from trans-conductance stage 10 is both conducted to power supply Vdd and integrated on the sampling capacitor CH as shown by $I_{CH0}$ in FIG. 4A. As discussed above, the ratio of current conducted to the power supply Vdd, i.e., current $I_{S0,r}$, and the current integrated on the sampling capacitor, i.e., $I_{CH0}$, during the O phase is inversely proportional to the ratio of the equivalent resistance of the reset switch and sampling capacitor, with the current $I_{S0,r}=\text{Iin0}-I_{CH0}$ in the O phase. Once the reset switch of the respective sampling channels switches to OFF state, all the input current from transconductance stage 10 is directed to the sampling capacitor CH of the respective sampling channel thus entering the I phase. The width $\Delta t$ of the integration current pulse for the respective sampling channels, i.e., $I_{CH0}$ to $I_{CH3}$, is approximately reduced by a factor of two at the control of the square-wave control signal as illustrated in FIG. 4A.

Figure 4C:
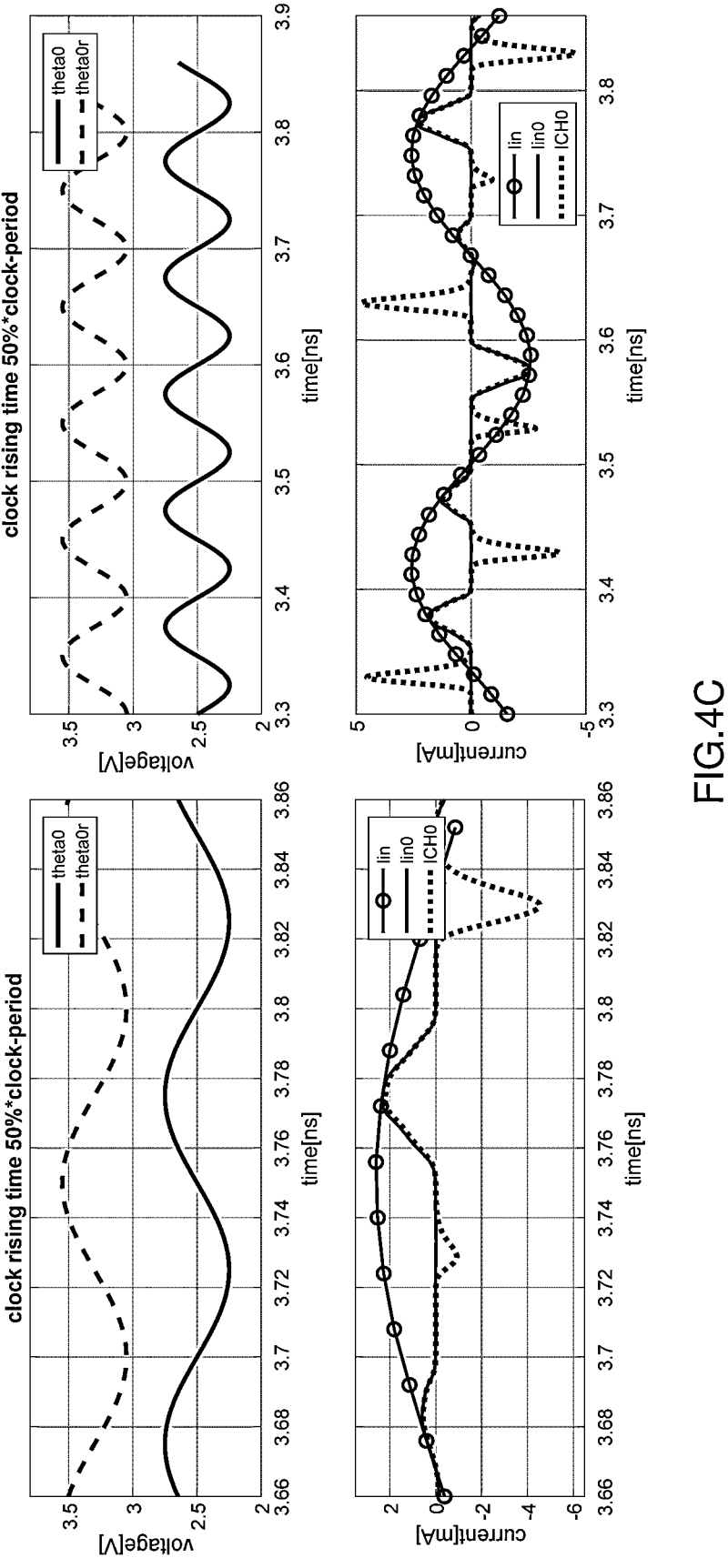

When clock rising time becomes longer, e.g., in the case when the control signals slew rate decreases, the ON state of the reset and sampling switches' state and their overlap phase become smaller. Consequently, less input current is conducted to the power supply Vdd in the overlap phase. As a result, more input current is integrated on sampling capacitor CH, and the ratio of $\Delta t/\Delta\text{tin}$ gets higher. This observation is illustrated in the right plot of FIG. 4A, FIG. 4B, and FIG. 4C. For fully sinusoidal control signals, as shown in FIG. 4C, the overlap phase is gone and almost all input current is integrated on sampling capacitor CH, i.e., $\Delta t/\Delta\text{tin}$ is around 100%. As a result, the radio of $\Delta t/\Delta\text{tin}$ ranges from 100% down to 50%, i.e., 50%<$\Delta t/\Delta\text{tin}$<100%, depending on the waveform and, therefore, the slew rate of the control signals.

Figure 5:
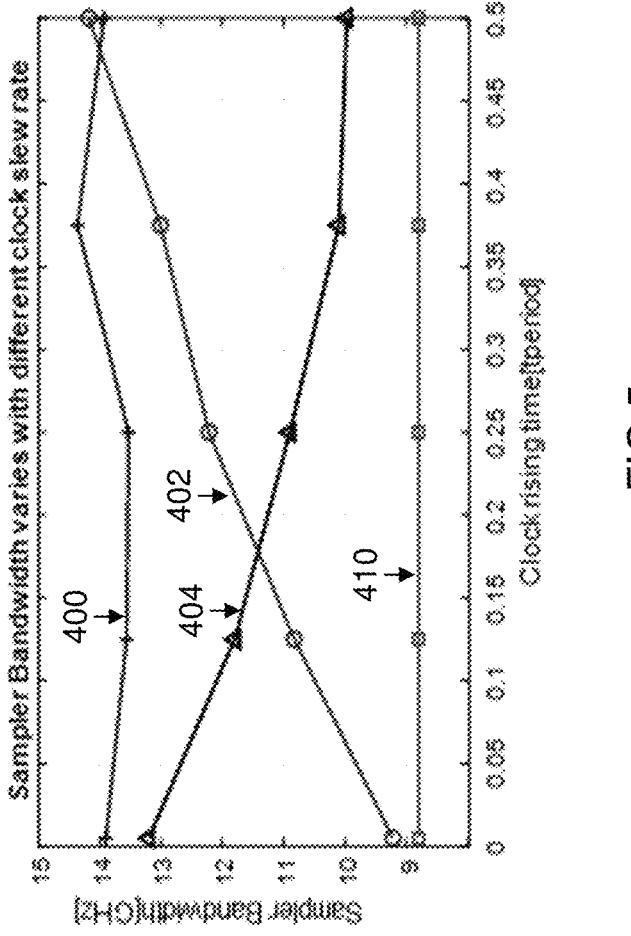
FIG. 5 shows an example of bandwidth for various sampling circuits for respective clock slew rates.

This can be viewed as another AND operation formed by $S_0$ and $S_{0,r}$ and their control signals $\theta_0$ and $\theta_{0,r}$. Herein, this AND operation is referred to as a reset-integration-overlap AND operation. This reset-integration-overlap AND operation behave in the opposite to the current-demux AND operation, as the clock slew rate decreases. As a result, $\Delta t$ becomes wider and the sampling circuit bandwidth drops by about 25% as denoted by curve 404 in FIG. 5. In a word, the reset-integration-overlap AND operation become weaker with the clock slew rate decreasing.

FIG. 2C shows an example of the time-domain outputs of the sampling channels of a four-channel time-interleaved sampling circuit. In this example, a sinusoidal input signal with frequency 1 GHz is sampled by the time-interleaved sampling circuit at 40 Gigasamples per second, i.e., Fs=40 Gsps, with the sampling channel being controlled by square-wave control signals using the clock strategy schema of FIG. 2B.

Summarized, the sampling circuits according to the present disclosure, the multi-channel time-interleaved sampling circuit 110 of FIG. 2A, has two AND operations. The first AND operation, i.e., the current-demux AND operation, is formed by the phase overlapped adjacent sampling control signals $\theta_1$ to $\theta_{M-1}$ and its sampling switch $S_0$ and $S_{M-1}$ which affect the sampling channel bandwidth as shown by curve 402 in FIG. 5. The second AND operation, i.e., the reset integration-overlap AND operation, is made by the phase overlapped reset control signals $\theta_{1,r}$ to $\theta_{M-1,r}$ and sampling control signals $f_1$ to $\theta_{M-1}$ and their respective switches $S_{0,r}$ to $S_{M-1,r}$ and $S_0$ to $S_{M-1}$ which effect on the sampling channel bandwidth is shown by curve 404 in FIG. 5 The resulting bandwidth 400 of the time-interleaved sampling circuit is equivalent to the sum of the bandwidth of the respective AND operations. This is because the two AND operations as described above have an opposite effect with respect to the slew rate of the control signals. As these two AND operations work together, their effect on the bandwidth of the sampling circuit cancels each other. As a result, the proposed sampling circuit, whether single-channel or time-interleaved multi-channel, is almost insensitive to clock slew rate as shown by curve 400. For comparison, curve 410 shows the bandwidth for the theoretical case without any AND operation.

Figure 6A:
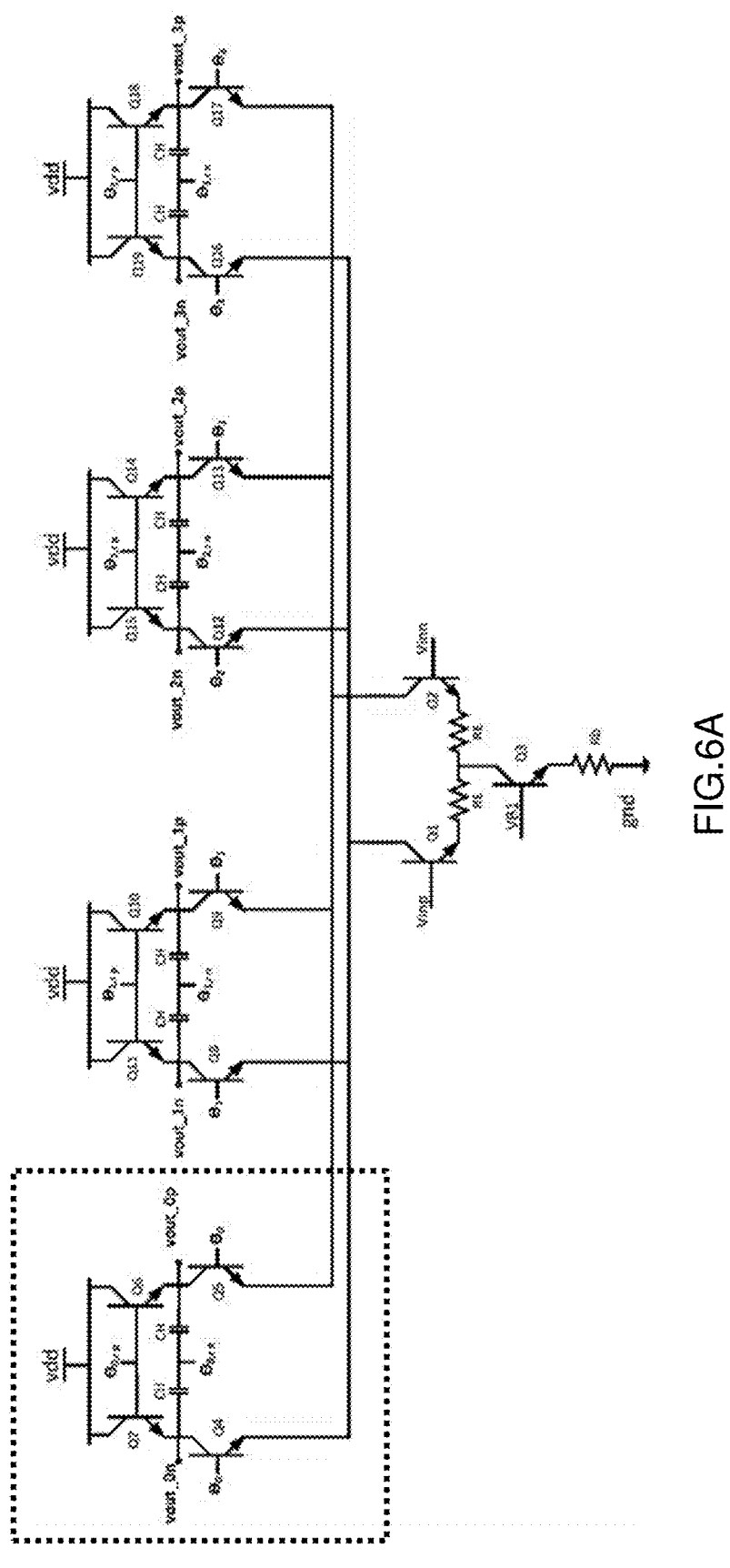
FIG. 6A shows a differential time-interleaved sampling circuit according to example embodiments of the present disclosure.
Figure 6B:
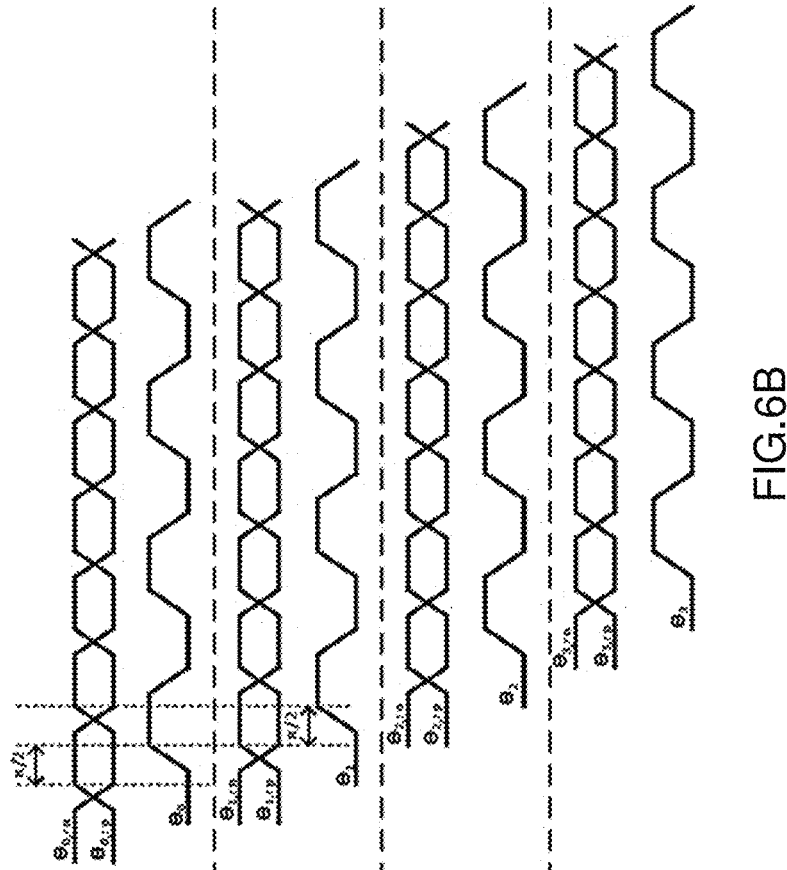
FIG. 6B shows an example clock strategy for the sampling and reset control signals for the time-interleaved sampling circuit of FIG. 6A.
Figure 6C:
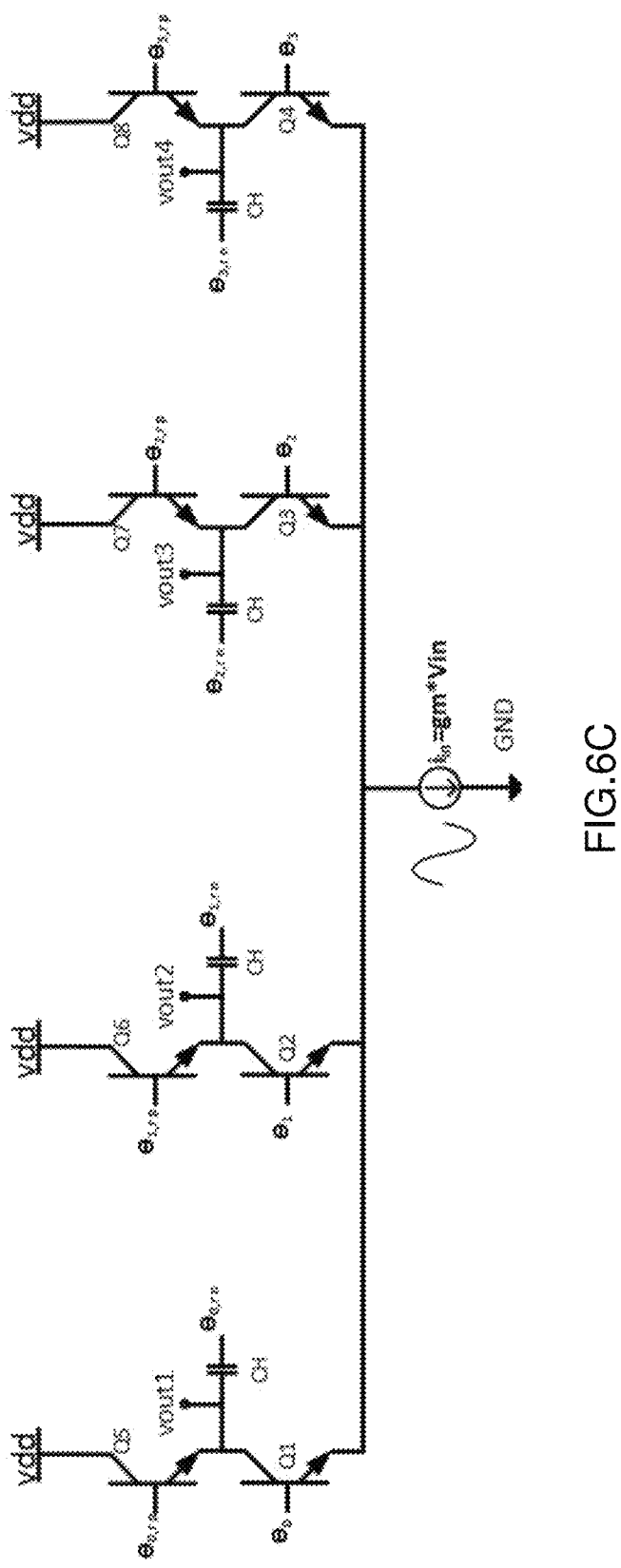
FIG. 6C shows a single-ended time-interleaved sampling circuit according to embodiments of the present disclosure.

FIG. 6A shows a differential implementation of the time-interleaved sampling circuit and FIG. 6B shows respective differential control signals for controlling the operation of the respective sampling channels. The sampling circuit comprises a transconductance stage and four sampling channels. The transconductance stage is formed by transistors Q1 to Q3 and resistors RE and Rb. The transconductance stage is used as a linear voltage to the current converter. In the first sampling channel, outlined in the figures with a dashed line, the sampling switches Q4 and Q5 are controlled by the sampling control signal $\theta_0$ and the reset switches Q6 and Q7 and the sampling capacitor CH are operated by reset control signals $\theta_{0,rp}$ and $\theta_{0,rn}$. As shown in FIG. 6B, the sampling control signal $\theta_0$ is delayed with respect to the reset control signal $\theta_{0,rp}$ by a quarter of the signal's period. Furthermore, the control signals $\theta_0$, $\theta_{0,rp}$ and $\theta_{0,rn}$ are all a quarter data rate, 50% duty cycle signals. All of those control signals can have any slew rate which means their waveform can range from square to sinusoidal. Those four evenly phase-shifted sampling control signals, i.e., $\theta_0$ to $\theta_3$, control the sampling switches Q4 and Q5 by alternatively steering the current from the transconductance stage to the capacitor CH. On the other side, the phase overlapped sampling and reset control signals conduct the current to the power supply and the sampling capacitor. The other three sampling channels of the time-interleaved sampling circuit have the same circuit design and operation. The switches may be CMOS and BiCMOS, and possibly III-V transistors, while the sampling capacitor can be replaced by a resistor. In that case, the sampling circuit operates like a sampling mixer. The same sampling operation may be achieved by a single-ended implementation as shown in FIG. 6C.

As used in this application, the term "circuitry" may refer to one or more or all of the following:

(a) hardware-only circuit implementations such as implementations in only analog and/or digital circuitry and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions) and (c) hardware circuit(s) and/or processor(s), such as microprocessor(s) or a portion of a microprocessor(s), that requires software (e.g., firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example, and if applicable to the particular claim element, a baseband integrated circuit or processor integrated circuit for a mobile device or a similar integrated circuit in a server, a cellular network device, or other computing or network device.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the scope of the claims are therefore intended to be embraced therein.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A charge-based sampling circuit for sampling an analog input signal comprising: a capacitive means, a reset switch, and a sampling switch; the reset switch and the sampling switch being connected to a signal generator circuit configured to provide periodic reset and sampling control signals to the respective switches for controlling their operation;

wherein the respective periodic reset and sampling control signals have equal duty factors and signal periods, and a phase delay with respect to one another being less than the control signals' duty factor such that the reset control signal and the sampling control signal have an overlap phase, thereby forming a four-phase operation wherein during a reset phase, the reset switch is closed such that the terminals of the capacitive means are shorted causing the capacitive means to discharge, and the sampling switch is open disconnecting the analog input signal from the capacitive means;

during the overlap phase the reset switch remains closed and the sampling switch is closed connecting the analog input signal to the capacitive means thereby, by the non-zero resistance of the reset switch, partly integrating the analog input signal onto the capacitive means by a pre-charge value depending on a slew rate of the control signals, wherein the overlap phase is subsequent to the reset phase;

during a subsequent integration phase, the reset switch is open and the sampling switch remains closed thereby integrating the analog input signal onto the capacitive means;

during a subsequent hold phase the sampling switch is open and the reset switch remains open such that an integrated charge on the capacitive means is held constant.

2. The charge-based sampling circuit according to claim 1, wherein the reset and sampling control signals have variable clock slew rates.

3. The charge-based sampling circuit according to claim 2, wherein the reset and sampling control signals have a square waveform, or, a sinusoidal waveform.

4. The charge-based sampling circuit according to claim 1, wherein duty factor of the reset and sampling control signals is one-half the control signals' period, and the phase delay is greater than zero and smaller than one half of the control signals' period.

5. A time-interleaved charge-based sampling circuit comprising M charge-based sampling circuits according to claim 1 configured to provide M sampled signals in a time-interleaved manner.

6. The time-interleaved charge-based sampling circuit according to claim 5, wherein the M charge-based sampling circuits are configured to successively sample the analog input signal.

7. The time-interleaved charge-based sampling circuit according to claim 5, wherein the operation of the respective charge-based sampling circuits is delayed by 1/M of the control signals' period.

8. The time-interleaved charge-based sampling circuit according to claim 5, wherein the duration of the reset phase is 1/M of the control signal's period, and wherein the duration of the overlap phase is one half of the control signal's period minus 1/M of the control signal's period.

9. An analog-to-digital converter comprising a charge-based sampling circuit according to claim 1 or a time-interleaved charge-based sampling circuit configured to provide M sampled signals in a time-interleaved manner.

10. A method for sampling an analog input signal by means of a charge-based sampling circuit comprising a capacitive means, a reset switch, and a sampling switch, the method comprising providing periodic reset and sampling control signals to the respective switches for controlling their operation;

wherein the respective periodic reset and sampling control signals have equal duty factors and signal periods, and a phase delay with respect to one another being less than the control signals' duty factor such that the reset control signal and the sampling control signal have an overlap phase; and wherein the providing the reset and sampling control signals further comprises:

during a reset phase, closing the reset switch such that the terminals of the capacitive means are shorted causing the capacitive means to discharge, and keeping the sampling switch open thereby disconnecting the analog input signal from the capacitive means;

during the overlap phase keeping the reset switch closed and closing the sampling switch thereby connecting the analog input signal to the capacitive means and thereby, by the non-zero resistance of the reset switch, partly integrating the analog input signal onto the capacitive means by a pre-charge value depending on a slew rate of the control signals, wherein the overlap phase is subsequent to the reset phase;

during a subsequent integration phase, opening the reset switch and keeping the sampling switch closed thereby integrating the analog input signal onto the capacitive means; and during a subsequent hold phase opening the sampling switch and keeping the reset switch open such that an integrated charge on the capacitive means is held constant.

11. A method for sampling an analog input signal by means of a time-interleaved charge-based sampling circuit comprising M charge-based sampling circuits, the charge-based sampling circuits respectively comprising a capacitive means, a reset switch, and a sampling switch and being configured to sample the analog input signal to provide M sampled signals related to the analog input signal, the method comprising:

controlling the reset and sampling switch of the respective M charge-based sampling circuits by the method according to claim 10.

12. The method according to claim 11 further comprising controlling the reset and the sampling switches of the respective charge-based sampling circuits such that the operation of the respective charge-based sampling circuits is delayed by 1/M of the control signals' period.

\* \* \* \* \*